US007696742B2

(12) United States Patent
Kunc et al.

(10) Patent No.: US 7,696,742 B2
(45) Date of Patent: Apr. 13, 2010

(54) METHOD AND CIRCUIT FOR REDUCING NOISE WHEN MEASURING INTENSITY OF ELECTRIC CURRENT

(76) Inventors: Vinko Kunc, Gerbiceva 50, Ljubljana (SI) 1000; Maja Atanasijevic-Kunc, Slovenska 55, Ljubljana (SI) 1000; Andrej Vodopivec, Sojerjeva 63, Ljubljana (SI) 1000

( * ) Notice: Subject to any disclaimer, the term of this patent is extended or adjusted under 35 U.S.C. 154(b) by 0 days.

(21) Appl. No.: 11/664,110

(22) PCT Filed: Sep. 29, 2005

(86) PCT No.: PCT/SI2005/000029

§ 371 (c)(1),
(2), (4) Date: Apr. 1, 2008

(87) PCT Pub. No.: WO2006/036132

PCT Pub. Date: Apr. 6, 2006

(65) Prior Publication Data
US 2008/0284411 A1 Nov. 20, 2008

(30) Foreign Application Priority Data
Sep. 29, 2004 (SI) ............................. P-200400272

(51) Int. Cl.
*G01R 19/00* (2006.01)
*G01R 1/30* (2006.01)
(52) U.S. Cl. ................................ 324/123 R; 324/765
(58) Field of Classification Search ............... None
See application file for complete search history.

(56) References Cited
U.S. PATENT DOCUMENTS
4,138,640 A 2/1979 Cousins

| 4,342,960 | A | * | 8/1982 | Sawada | 324/772 |
| 4,577,151 | A | * | 3/1986 | Tanisaka et al. | 324/772 |
| 4,786,877 | A | * | 11/1988 | Leydier | 330/9 |
| 4,945,306 | A | * | 7/1990 | Lowther | 324/220 |
| 5,629,647 | A | * | 5/1997 | Fassina et al. | 330/2 |
| 6,229,389 | B1 | * | 5/2001 | Pullen et al. | 330/10 |
| 6,784,728 | B2 | * | 8/2004 | Fischer | 327/554 |
| 7,518,413 | B2 | * | 4/2009 | Kurihara | 327/77 |

FOREIGN PATENT DOCUMENTS
DE 10040629 3/2002
GB 1414985 11/1975

* cited by examiner

*Primary Examiner*—Vinh P Nguyen
(74) *Attorney, Agent, or Firm*—Jacobson Holman PLLC

(57) ABSTRACT

The measurement of a very low intensity of an electric current is carried out by 5 integrating the electric current over integration cycles having a time period ti and measuring a peak value of a sawtooth voltage at an integrated circuit output each time at the end of the integration cycle, whereat noise voltage components of a frequency above a cut-off frequency, which has a value of the order of magnitude $(0,1 \times 2\pi \times ti)^{-1}$, being parts of a voltage of a noise generated in an operational amplifier comprised in the integrated circuit are filtered out of the said sawtooth voltage and noise components, which have the origin in the high-frequency voltage components of Johnson noise, which appear in the low-frequency spectral part of the sawtooth voltage as aliasing, are subtracted from a filtered sawtooth voltage. A higher absolute accuracy of the measurement is achieved by means of a reduction of the direct as well as the aliasing contribution of the Johnson noise of the operational amplifier in the measuring circuit.

5 Claims, 4 Drawing Sheets

METHOD AND CIRCUIT FOR REDUCING NOISE WHEN MEASURING INTENSITY OF ELECTRIC CURRENT

The invention concerns a method and a circuit provided for measuring a very low intensity of an electric current by integrating the electric current over integration cycles and measuring a peak value of a sawtooth voltage at an integrated circuit output each time at the end of the integration cycle, whereat the method and the circuit of the invention are improved so that a direct and an aliasing contribution to the output voltage of a noise, which is generated in an operational amplifier comprised in the integrated circuit, are reduced.

The technical problem of the invention is how to improve a method and a circuit provided for measuring a very low intensity of an electric current by integrating the electric current over time so that the influence of a noise, which is generated in an operational amplifier comprised in an integrated circuit, in the output voltage will be reduced.

A very low intensity electric current is usually integrated over time in order to measure its intensity. Such measurement according to the state of the art is represented by a part of a circuit in FIG. 1. The electric current i originating from a current source is conducted to an input of an operational amplifier A, whose output is connected to its input through an integration capacitor Ci. In an output voltage uo, however, a noise of the operational amplifier A in the integrated circuit is included.

Figure 1:
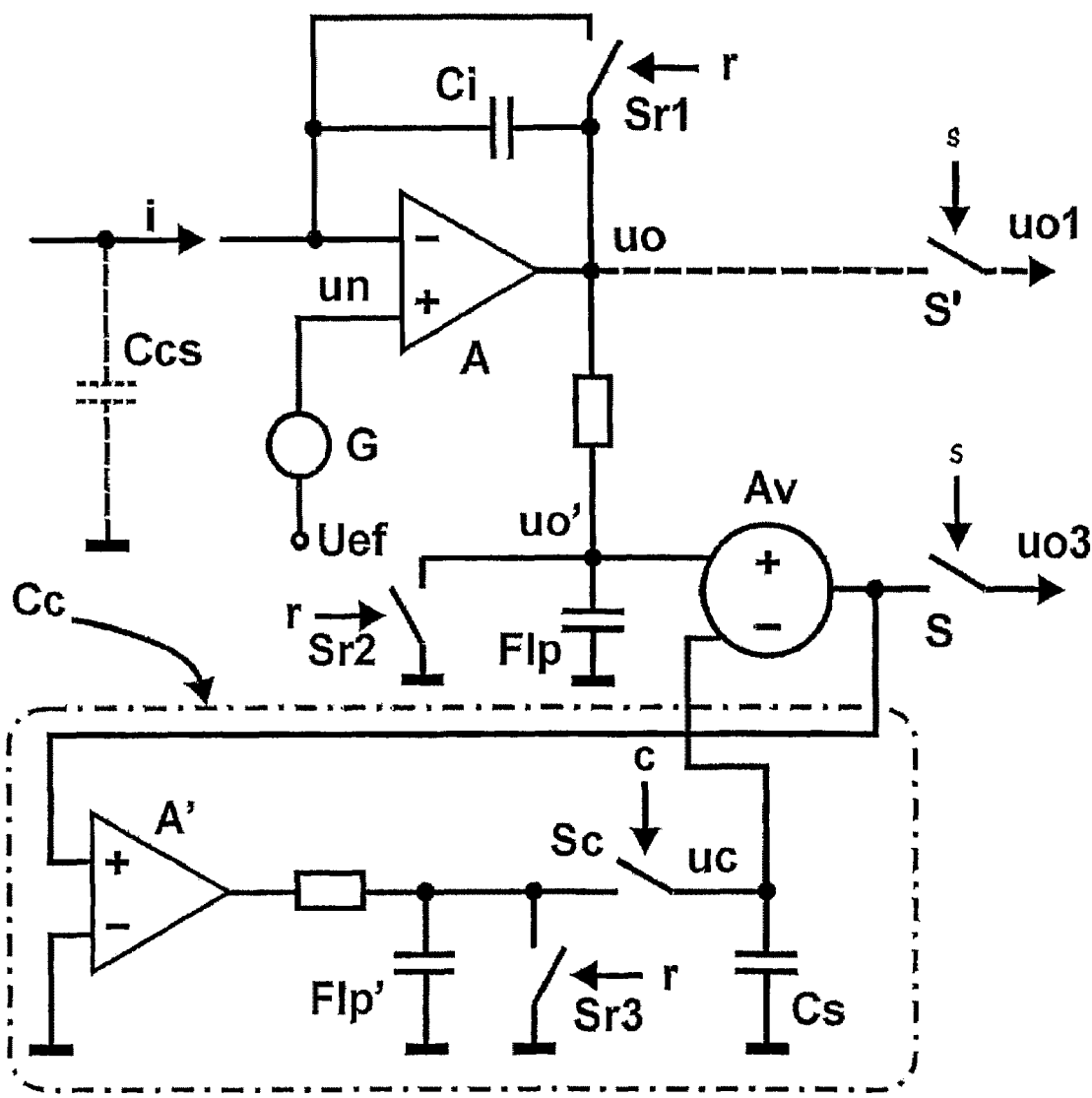

There is a direct contribution of the noise—a Johnson noise and a 1/ti noise (flicker noise)—of the operational amplifier A on the one hand, the source of this noise contribution being represented in FIG. 1 by a generator G of a noise voltage un. The generator G is connected between a connecting terminal for a reference voltage Uref and the reference input of the operational amplifier A. To demonstrate the effect of the noise let the generator G generate a sinus signal un, which has an amplitude of 10 mV and a frequency of 100 kHz (window 5 in FIG. 2). If at the same time an electric current (50 nA) comes out from a current source having a very high internal resistance and a capacitance Ccs (100 pF) parallel thereto, the contribution of the noise voltage un to the output voltage uo of the operational amplifier A is amplified by a factor 1+Ccs/Ci, i.e. 11 times (window 1 in FIG. 2), if an integration capacitor Ci having a capacitance of 10 pF is used.

Figure 2:
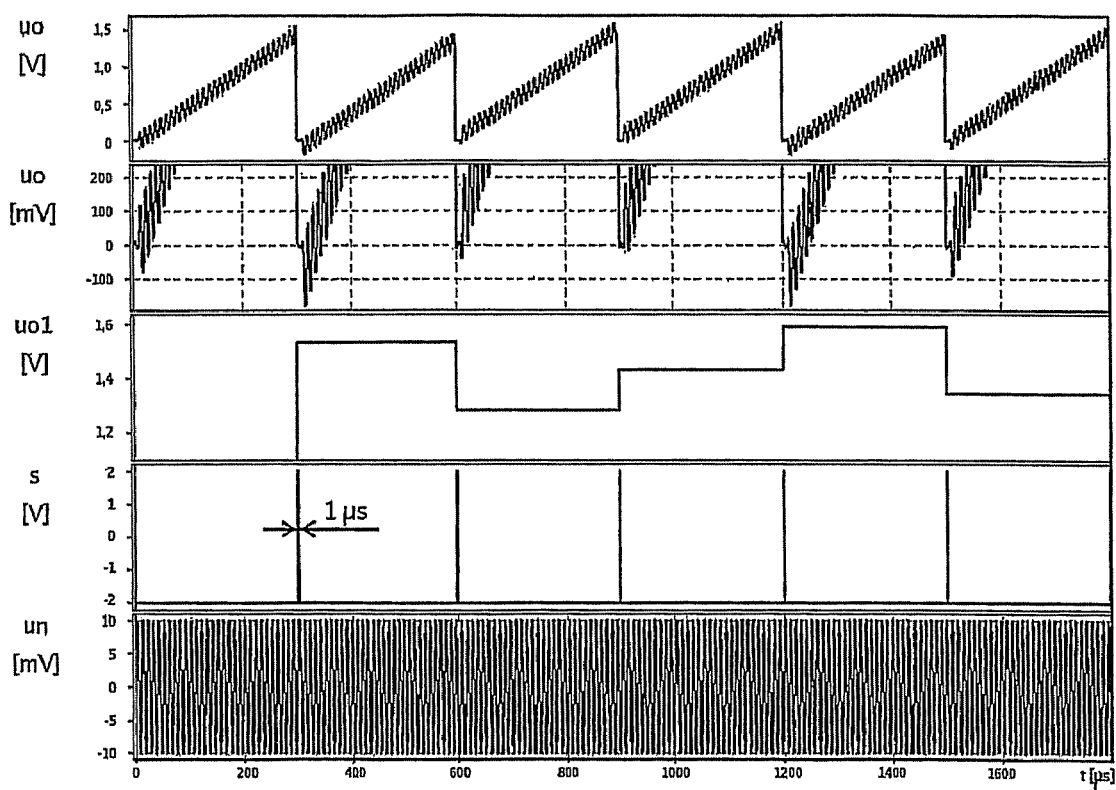

If the intensity of the electric current i is constant, the voltage uo at the output of the integrated circuit steadily increases (window 1 in FIG. 2). The voltage uo, however, can increase only up to the supply voltage value of the operatinal amplifier, whereafter the integration stops and the integration capacitor Ci discharges itself through a resetting switch Sr1. The output voltage uo of the integrating circuit has a sawtooth form. An integration cycle—in the simulation having a time period lasting 300 μs—is repeated again and again.

On the other hand, however, a noise contribution to the output voltage uo also exists as an aliasing noise of the operational amplifier A due to the switching over of the resetting switch Sr1, whereby the periodic discharge of the integration capacitor Ci is made possible. The aliasing appears when a continuous signal is interrupted. It is a phenomenon in which high-frequency components of the original analogue signal, which have a frequency exceeding one half of the sampling frequency, appear as low-frequency components in the output signal. When the resetting switch Sr1 is closed, the voltage at a terminal of the current source follows the noise voltage un, which is also present at the reference voltage terminal of the operational amplifier A. Therefore, immediately after the opening of the resetting switch Sr1 a voltage having an instantaneous value equaling the sum of the reference voltage and the noise voltage un remains on this terminal. An electric charge, which corresponds to the difference of a later instantaneous noise voltage value and of the noise voltage value at the moment when the resetting switch Sr1 has been opened, then flows from the capacitor having a capacitance Ccs and for this reason the output voltage uo changes for said difference multiplied by a factor Ccs/Ci. Thus because of closing and opening the resetting switch Sr1 also the described contribution of the noise voltage un of the operational amplifier A amplified by the factor Ccs/Ci, is transferred into the output voltage uo. It appears like a random variation of the initial value of the output voltage uo from one integration cycle to another (window 2 in FIG. 2).

Both contributions of the noise of the operational amplifier A to the output voltage uo of the integrated circuit are reflected in a sampled voltage uo1 (window 3 in FIG. 2) from which the intensity of the electric current i is determined by means of the state of the art measurement. The sampling by means of a switch S', which is controlled by a signal s lasting 1 μs, is performed each time 1 μs before the end of the integration cycle (window 4 in FIG. 2). The sampled voltage uo1 varies even by 300 mV; the direct contribution of the noise of the operational amplifier A is 220 mV (11×10 mV×2) and the aliasing contribution of this noise is 80 mV.

The said technical problem is solved by a method of the invention as characterized by the features of the characterizing portion of the first claim and by a circuit of the invention as characterized by the features of the characterizing portion of the second claim, whereas the variants of the embodiment of the circuit of the invention are characterized by dependent claims.

The method and the circuit of the invention provided for measuring a very low intensity of an electric current distinguish themselves by a reduction of the direct as of well as the aliasing contribution of the noise of the operational amplifier in the measuring circuit and by a higher absolute accuracy of the measurement achieved thereby.

The invention will now be explained in more detail by way of the description of an embodiment of a method and a circuit of the invention and with reference to the accompanying drawing representing in FIG. 1 the circuit of the invention provided for measuring a very low intensity of an electric current with a part of this circuit being the known circuit of this kind, FIG. 2 shows waveforms used to explain the prior art part of the circuitry of FIG. 1.

Figure 3:
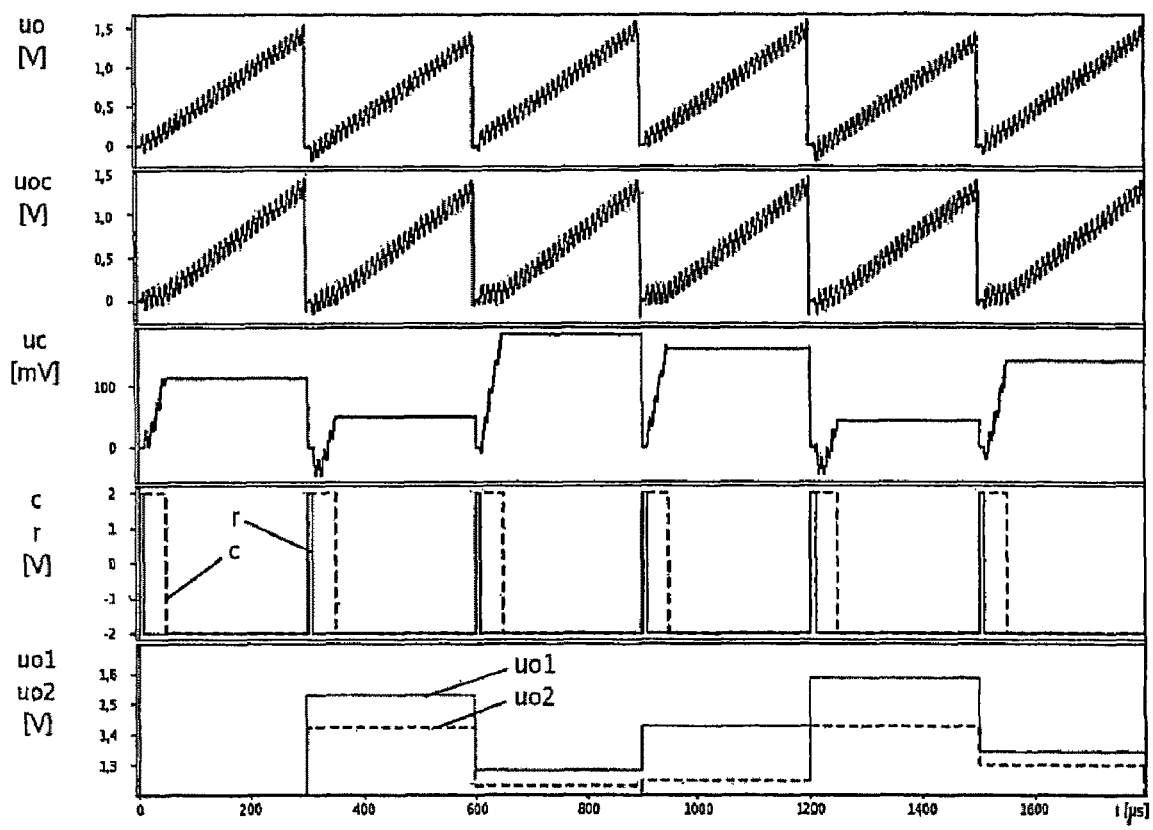
Figure 4:
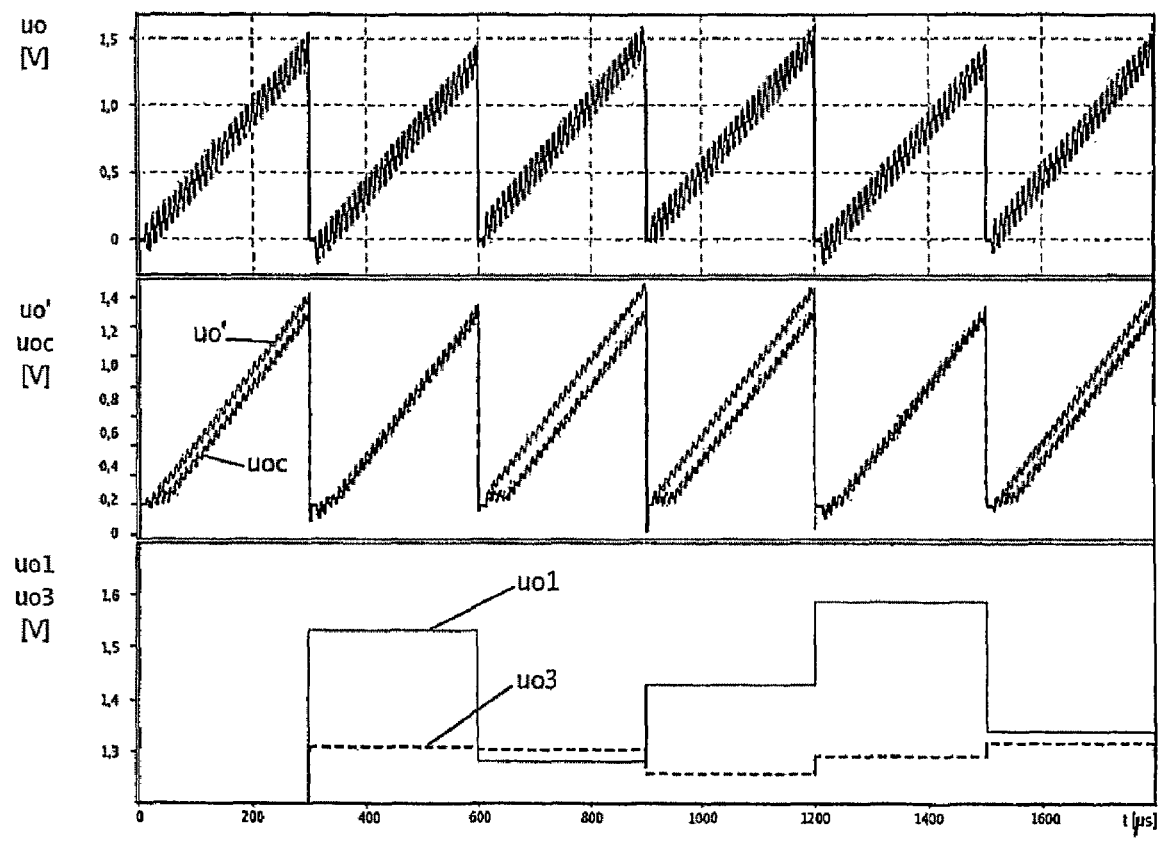

FIG. 3 graphs presenting time dependence of a simulated voltage at the output of the integrated circuit, the same simulated voltage on a larger scale at the beginning of integration cycles, a simulated correcting voltage at an output of a correcting circuit, a control signal for carrying out a resetting of capacitors and a control signal for performing a correction of the output voltage, and a simulated sampled output voltage according to the state of the art or when just a correction due to the aliasing contribution to the noise of the operational amplifier due to a switching over of a resetting switch, which is provided for a periodic discharging of the integration capacitor, is taken into account, in the case of a circuit, which differs from the circuit of the invention in that there is no low-pass filter, and Fig 4 graphs presenting the time dependence of a simulated voltage at the output of the integrated circuit, a simulated voltage behind a low-pass filter or as corrected for the aliasing contribution to the noise of the operational amplifier due to a switching over of a resetting switch, which is provided for a periodic discharging of the integration capacitor, and a simulated sampled output voltage of the circuit according to the state of the art and of the circuit of the invention, respectively, all for the circuit of the invention.

According to the invention the known method provided for measuring a very low intensity of an electric current is improved by three additional steps.

First, components of a frequency above a cut-off frequency whith a value of the order of magnitude of $(0.1 \times 2\pi \times ti)^{-1}$, which are parts of the voltage of a noise generated in an operational amplifier comprised in the integrated circuit are filtered out from the said sawtooth voltage uo. A filtered sawtooth voltage uo' is obtained (window 2 in FIG. 4).

Then a mean value uc of a residual noise voltage in the filtered sawtooth voltage uo' is measured in a short time interval of the order of magnitude between $0.01 \times ti$ and $0.02 \times ti$ at the beginning of each integration cycle when the contribution of the integral of the measured electric current i to the voltage uo is still small.

Namely, the noise voltage components generated in the operational amplifier comprised in the integrated circuit and having the frequency below a cut-off frequency, which has a value of the order of magnitude $(0.1 \times 2\pi \times ti)^{-1}$ as well as the noise voltage components having the origin in the high-frequency voltage components of said noise, which appear as aliasing in the low-frequency spectral region of the sawtooth voltage uo, are still present in the filtered sawtooth voltage uo'.

And finally, the measured mean value uc of the residual noise voltage is subtracted from the filtered sawtooth voltage uo'. A corrected voltage uoc is obtained (window 2 in FIG. 4), which is sampled and appears at the output of the circuit of the invention as voltage uo3 (window 3 in FIG. 4).

The presented method of the invention is carried out by a circuit provided for measuring a very low intensity of the electric current (FIG. 1). The circuit of the invention is an improved state-of-the-art circuit as represented above.

The said sawtooth voltage uo from the output of the operational amplifier A or the integrated circuit is conducted through a first low-pass filter Flp, which has an upper cut-off frequency with a value of the order of magnitude $(0.1 \times 2\pi \times ti)^{-1}$, to an input of addend of an voltage adder Av, ti being a time period of integration cycles.

An output of the voltage adder Av is connected to an input of a correction circuit Cc of the invention and to a first terminal of a sampling switch S, at whose second terminal an output voltage uo3 of the circuit of the invention provided for measuring very low intensity of the electric current i is tapped.

The correction circuit Cc consists of, connected in series, an operational amplifier A', whose noninverting input is connected to an output of the voltage adder Av, a second low-pass filter Flp', a switch Sc provided to renew a correction voltage uc, and a capacitor Cs, whose one terminal is connected to mass and which is provided to store the correction voltage uc.

The output of the correction circuit Cc is connected to an input of subtrahend of the voltage adder Av.

At the beginning of each integration cycle the switch Sc closes in order to renew the correction voltage uc. The time constant of the second low-pass filter Flp' is chosen so that the time constant of the correction circuit Cc is approximately three times shorter than the time interval in which the switch Sc is closed and in which the value of the correction voltage uc is set and settled, this time interval, however, depends on the time period ti of the integration cycle. The longer the time interval, in which the switch Sc is closed, the higher is a spurious contribution of the integral of the measured intensity of the electric current i to the measured value of the correction voltage uc. On the other hand, however, the contributions of low-frequency components of the noise voltage are not included, if the switch Sc is closed for a too short time interval. Therefore the switch Sc is closed for a time interval, which depends on time period ti of the integration cycle, preferably for a time interval between $0.01 \times ti$ and $0.02 \times ti$.

A corresponding controlled switch Sr2, Sr3 controlled by a resetting signal r discharges a capacitor in the first low-pass filter Flp and a capacitor in the second low-pass filter Flp', respectively, at the end of each integration cycle.

The noise voltage is removed from the output voltage uo of the integrated circuit by means of the improved method and circuit provided for measuring very low intensity of the electric current. The noise voltage consists of a direct contribution of a Johnson noise and of a 1/ti noise of the operational amplifier A and of an aliasing contribution of the Johnson noise and the 1/ti noise of the operational amplifier A due to the switching over of a resetting switch Sr1, which is provided for a periodic discharging of the integration capacitor Ci.

The effective value of the noise voltage in the first contribution is proportional to a square root of the frequency bandwidth as covered by the measurement in the part corresponding to the Johnson noise and is inversely proportional to the frequency in the part corresponding to the 1/ti noise. The frequency band of the noise voltage at the output of the integrated circuit is limited upwards by a time constant, which is determined by the resistance of the resetting switch Sr1 when it is closed and by the capacitance Ccs of the current source. Said time constant must be low so that the pole representing it is situated in a high-frequency region, i.e. over the upper limit of the frequency band of the operational amplifier A so that it can operate in a stable manner. Therefore the noise of the operational amplifier A has a wide bandwidth. Hence the effective value of the noise voltage in the first contribution to the output voltage uo of the integrated circuit decreases in that the signal uo from the output of the integrated circuit passes the low-pass filter Flp, whose time constant is reasonably of the order of magnitude of one tenth of the time period ti of the integration cycle. The sawtooth voltage uo and the filtered sawtooth voltage uo' behind the low-pass filter Flp are represented in windows 1 and 2, respectively, in FIG. 4, whereat the noise voltage un is simulated by a sinus signal un having an amplitude 10 mV and a frequency 100 kHz (window 5 in FIG. 2) and generated by the generator G.

The Johnson noise of the operational amplifier A due to its wide bandwidth as well as the 1/ti noise of the operational amplifier A since the low-frequency region is in question influence the effective value of the noise voltage in the second contribution. The resetting switch Sr1 maps the high-frequency components of the generated noise signal into the low-frequency band of the output voltage uo of the integrated circuit in the moment when it opens. For this reason the noise components, which appear as aliasing in the low-frequency spectral part of the sawtooth voltage uo and which have the origin in the high-frequency voltage components of said Johnson noise, as well as the low-frequency components of the 1/ti noise of the operational amplifier A have to be subtracted from the filtered sawtooth voltage uo'. After the resetting signal r has died down, the control signal c for carrying out the correction of the filtered output voltage uo' closes the controlled switch Sc for a time interval in the length from one hundredth to one tenth of the time period ti of the integration cycle (window 4 in FIG. 3) in order to renew the correction voltage uc at the beginning of each integration cycle. The voltage in the correction circuit Cc settles in this short time interval and the mean noise voltage in the filtered sawtooth voltage uo' is established on the capacitor Cc as the correction voltage uc. Of course, this value is not quite exact due to the short measurement time.

The correction voltage uc is represented in window 3 in FIG. 3, in which Figure also the voltages uo and uoc are represented, which refer to a circuit without a first low-pass filter Flp (not shown).

A feedback loop, which causes the voltage at the output of the voltage adder Av to become zero, through the correction circuit Cc closes. A determination of the correction voltage uc is made possible in this way. Therefore the operational amplifier A' must have a high enough gain and the low-pass filter must be properly chosen. The mean noise voltage, which still remained in the filtered sawtooth voltage uo', continues to exist on the capacitor Cs provided to store the correction voltage uc. The existing mean noise voltage is equal to the necessary correcting voltage uc, which after opening the switch Sc, gets subtracted from the filtered output voltage uo' in the remaining part of the integration cycle in the voltage adder Av.

The voltage uoc at the output of the voltage adder Av is sampled by a switch S, which is controlled by a signal s, which lasts 1 µs and appears each time 1 µs before the end of the integration cycle. The sampled output voltage uo3 of the circuit of the invention is represented as compared to an output voltage uo1 of of the circuit according to the state of the art (window 3 in FIG. 4). The sampled output voltage uo3 of the circuit of the invention fluctuates only for 60 mV at the constant measured current i.

A comparison of the sampled output voltage uo1 of the circuit according to the state of the art to the sampled output voltage uo2 of a circuit (not shown), in which the voltage adder Av is connected immediately to the output of the integrated circuit is represented as well (window 5 in FIG. 3); the sampled output voltage uo2 fluctuates for 220 mV at the constant measured current i.

The invention claimed is:

1. A circuit for measuring intensity of an electric current by integrating the electric current over integration cycles having a time period ti, comprising;
   a first operational amplifier (OPAMP) having first and second inputs and an output;
   means for measuring a peak value of a sawtooth voltage at the output of the first operational amplifier at the end of the integration cycle;
   a voltage adder having an addend input, a subtrahend input and an output;
   a first low-pass filter with an upper cut-off frequency, which has a value of the order of magnitude $(0{,}1 \times 2\pi \times ti)^{-1}$, for connecting the output of the first OPAMP to the addend input of the voltage adder;
   a second OPAMP having first and second inputs and an output;
   a second low-pass filter having an input and an output, the input of the second low-pass filter connected to the output of the second OPAMP;
   a first switch having an input and an output, the input of the switch connected to the output of the output of the second low-pass filter;
   means for connecting the output of the first switch to the subtrahend input of the voltage adder and to a capacitor to provide a correction voltage from the output of the second OPAMP and a capacitor, whose one terminal is connected to mass and provided to store the correction voltage being stored in the capacitor;
   means for connecting output of the voltage adder to the first input of the second OPAMP; and
   the second OPAMP, the second low-pass filter, and the switch constituting a correction circuit, wherein the time constant of the correction circuit is approximately three times shorter than a time interval in which the switch remains closed.

2. The circuit provided for measuring intensity of an electric current as recited in claim 1, wherein the first switch provided to renew the correction voltage is closed for a time interval between 0,01×ti and 0,02×ti at the beginning of each integration cycle.

3. The circuit provided for measuring intensity of an electric current as recited in claim 1, further comprising: third and fourth switches, wherein the first low-pass filters has a first capacitor connected to the third switch and the second low-pass filter has a second capacitor connected to the fourth switch and the first capacitor in the first low-pass filter and the second capacitor in the second low-pass filter discharge through their respective switches at the end of each integration cycle.

4. The circuit of claim 1 further comprising an output sampling switch and means for connecting the output of the voltage adder and the first input of the second OPAMP to an output sampling switch.

5. A method for measuring intensity of an electric current in an integrated circuit with an operational amplifier (OPAMP) by integrating the electric current over integration cycles having a time period ti, the method comprising the steps of:
   measuring a peak value of a sawtooth voltage at an output of the OPAMP at the end of each integration cycle;
   filtering out the sawtooth voltage components of a frequency above a cut-off frequency, which has a value on the order of magnitude $(0{,}1 \times 2\pi \times ti)^{-1}$, the filtered sawtooth voltage components being parts of a voltage of a noise generated in the OPAMP;
   measuring a mean value of a residual noise voltage in the filtered sawtooth voltage in a short time interval on the order of magnitude between 0,01×ti and 0,02×ti at the beginning of each integration cycle; and
   subtracting the measured mean value of the residual noise voltage from the filtered sawtooth voltage.

* * * * *